United States Patent
Huang et al.

(10) Patent No.: US 10,883,002 B2
(45) Date of Patent: Jan. 5, 2021

(54) CONDUCTIVE PASTE COMPOSITION AND SOLAR CELL USING THE CONDUCTIVE PASTE COMPOSITION

(71) Applicant: PANCOLOUR INK CO., LTD., Taoyuan (TW)

(72) Inventors: Ying-Hua Huang, Taoyuan (TW); Hung-Ing Chang, Taoyuan (TW); Yu-Ching Pai, Taoyuan (TW)

(73) Assignee: PANCOLOUR INK CO., LTD., Taoyuan (TW)

(*) Notice: Subject to any disclaimer, the term of this patent is extended or adjusted under 35 U.S.C. 154(b) by 0 days.

(21) Appl. No.: 16/227,057

(22) Filed: Dec. 20, 2018

(65) Prior Publication Data
US 2020/0199376 A1    Jun. 25, 2020

(51) Int. Cl.
| | |
|---|---|
| *H01B 1/22* | (2006.01) |
| *C09D 5/24* | (2006.01) |
| *H01L 31/00* | (2006.01) |
| *H01L 31/0224* | (2006.01) |
| *C03C 4/14* | (2006.01) |
| *C03C 8/18* | (2006.01) |
| *C09D 7/63* | (2018.01) |

(52) U.S. Cl.
CPC ............... *C09D 5/24* (2013.01); *C03C 4/14* (2013.01); *C03C 8/18* (2013.01); *C09D 7/63* (2018.01); *H01B 1/22* (2013.01); *H01L 31/022425* (2013.01); *C03C 2204/00* (2013.01); *C03C 2205/00* (2013.01)

(58) Field of Classification Search
CPC ... H01B 1/00; H01B 1/16; H01B 1/22; C09D 5/24
See application file for complete search history.

(56) References Cited

U.S. PATENT DOCUMENTS

| | | | |
|---|---|---|---|
| 2005/0027041 A1* | 2/2005 | Kusano | B01F 3/1221 523/324 |
| 2013/0011959 A1* | 1/2013 | Konno | H01B 1/22 438/98 |
| 2017/0104112 A1* | 4/2017 | Won | H01L 31/022425 |
| 2018/0182907 A1* | 6/2018 | Zhang | H01L 31/022425 |

* cited by examiner

*Primary Examiner* — Mark Kopec
(74) *Attorney, Agent, or Firm* — Schmeiser, Olsen & Walts, LLP

(57) ABSTRACT

A conductive paste composition, including aluminum powder; an organic carrier including an organic solvent and resin or cellulose; and phenoxy alkyl alcohol accounting for 2~10% of weight of the conductive paste composition. The conductive paste composition includes the phenoxy alkyl alcohol, and thus resultant conductive paste not only has enhanced surface tension, but also has an increased difference in surface tension between the resultant conductive paste and a cell to therefore alter wetting behavior between the paste and a silicon wafer, to reduce the broadening behavior of the wiring lines printed, increase the aspect ratio of printing wiring, increase the light-receiving area of the solar cells, and enhance the photovoltaic conversion efficiency of the solar cells (especially local back surface field solar cells and PERC bifacial cells).

15 Claims, No Drawings

CONDUCTIVE PASTE COMPOSITION AND SOLAR CELL USING THE CONDUCTIVE PASTE COMPOSITION

FIELD OF THE INVENTION

The present disclosure relates to a conductive paste composition and a solar cell using the conductive paste composition.

BACKGROUND OF THE INVENTION

Fine-line printing is widely applicable to solar cells, especially conductive paste for use with solar cells. However, the line broadening issue arising from a fine-line printing process is likely to affect the photovoltaic conversion efficiency of the solar cells.

In an attempt to overcome the aforesaid drawback of the prior art, a method of controlling printing wiring line broadening, for example, augmenting the thixotropy of the printing paste, which entails introducing a thixotropy agent, such as fumed silica, hydrogenated castor oil, modified polyurea compound, and polyamide wax. With a thixotropy agent capable of thickening thixotropy, it is practicable to preclude line broadening behavior otherwise occurring during the fine-line printing process.

Furthermore, in an attempt to overcome the aforesaid drawback of the prior art, a surface tension modifier, such as glycol, is employed to augment the thixotropy of the printing paste and thus preclude line broadening behavior otherwise occurring during the fine-line printing process.

SUMMARY OF THE INVENTION

Still, the prior art fails to efficiently preclude line broadening behavior otherwise occurring during the fine-line printing process of solar cells. It is because conventional conductive paste (hereinafter referred to paste) is expected to be in satisfactory contact with silicon-based substrates, and thus the paste is good at fluidity and wetting. However, the paste is likely to wet the surfaces of printing substrates with high surface tension, because the printing substrates have higher surface tension than the paste; as a result, the printing of tiny wiring becomes intractable. Although the introduction of the thixotropy agent enhances paste thixotropy, the overall viscosity of the paste increases as well, causing problems as follows: difficulty in admission of the paste to the meshes of the screening templates, difficulty in feeding paste, ruptures of printing wirings, open circuits, and poor transmission of electrical charges, thereby leading to a reduction in the photovoltaic conversion efficiency of the solar cells.

Moreover, the conventional thixotropy agent features carbon-nitrogen bonds or contains inorganic constituents. During a sintering process performed to manufacture the solar cells, the carbon-nitrogen bonds or inorganic constituents are unlikely to be burned out completely and thus are likely to remain in the conductive layer, such as an aluminum layer. Furthermore, with the carbon-nitrogen bonds or inorganic constituents being non-conductive, traces of them in the conductive layer will affect the electrical conductivity of the solar cells.

A surface tension modifier, such as glycol, has high polarity and thus is seldom miscible with resin (especially ethyl cellulose) in the conductive paste, thereby destabilizing the conductive paste.

Therefore, there is an urgent need for a conductive paste composition applicable to silicon-based solar cells to not only reduce greatly the line broadening issue otherwise occurring during the solar cell fine-line printing process, but also enhance the photovoltaic conversion efficiency of the solar cells, so as to promote industrial development.

In order to achieve the above and other objectives, the present disclosure provides a conductive paste composition, comprising: aluminum powder; an organic carrier comprising an organic solvent and resin or cellulose; and phenoxy alkyl alcohol accounting for 2~10% of weight of the conductive paste composition.

In an embodiment illustrative of the conductive paste composition, the phenoxy alkyl alcohol accounts for 2~8% of weight of the conductive paste composition.

In an embodiment illustrative of the conductive paste composition, the phenoxy alkyl alcohol is phenoxy ethanol or phenoxy propanol.

In an embodiment illustrative of the conductive paste composition, the aluminum powder accounts for 60~85% of weight of the conductive paste composition.

In an embodiment illustrative of the conductive paste composition, the organic carrier has viscosity of 1~15 Kcps.

In an embodiment illustrative of the conductive paste composition, further comprising glass frit.

In an embodiment illustrative of the conductive paste composition, the organic carrier further comprises an additive selected from the group consisting of dispersing agent, leveling agent, defoaming agent, anti-precipitant, thixotropy agent and coupling agent.

The present disclosure further provides a solar cell, comprising the conductive paste composition.

The present disclosure is described below.

To enhance the photovoltaic conversion efficiency of the solar cells, it is necessary to enhance the quality of the solar cells and thus extend the service life of carriers, reduce series resistance of the solar cells, and increase open-circuit voltage (Voc) and short-circuit current (Isc). Recent years see the development of bifacial passivated emitter and rear cells (PERC), that is, PERC bifacial cells (hereinafter referred to as bifacial cells), each of which requires printing fine lines on the back side to form back surface field. With light reflecting off the ground or specific light beams being transmitted to the back side of the cell, upon their admission to the cell, the light beams form electron-hole pairs at the p-n junction. Fine lines are printed on the back side of the bifacial cell, thereby increasing the light-receiving area; however, if line broadening occurs, the efficiency of light absorption on the back side will decrease. Furthermore, the bifacial cells are especially useful in a snowing environment not taken care of by anyone, as the back sides can receive light and thus generate heat, thereby melting the snow on the front sides. Furthermore, bifacial cells manifest increased overall current efficiency, which is equivalent to increasing the light-receiving area of the cells. The conductive paste on conventional cells is capable of blocking light. A reduction in the paste-based light-blocking area brings an increase in the light-receiving area of the cell, thereby enhancing the photovoltaic conversion efficiency of the solar cells.

The aspect ratio of printing wirings must be increased in order to reduce light-blocking areas and maintain the same resistance when printing wirings on the solar cells (especially bifacial cells). The present disclosure is advantageous in that the introduction of the phenoxy alkyl alcohol with a specific ratio is effective in enhancing the surface tension of the paste, enhancing the difference in surface tension, reducing the wetting state between the paste and the silicon wafer, and reducing line broadening.

The phenoxy ethanol and the phenoxy propanol have a boiling point of around 240° C. Therefore, the phenoxy alkyl alcohol changes into a gas or is completely removed during the drying stage of the solar cell and thus does not affect the electrical properties of the solar cell.

The present disclosure is advantageous in that the phenoxy alkyl alcohol is introduced into the conductive paste composition to enhance the surface tension of the conductive paste, enhance the difference in surface tension between the conductive paste and the cell, alter the wetting behavior between the paste and the silicon wafer, reduce the broadening behavior of the wiring lines printed, increase the aspect ratio of printing wiring, increase the light-receiving area of the cell, and enhance the photovoltaic conversion efficiency of the solar cells (especially local back surface field solar cells and bifacial cells).

The conductive paste composition of the present disclosure reduces wiring line broadening behavior, increases aspect ratio of printing wiring, and increases the light-receiving area of the solar cell, so as to enhance the photovoltaic conversion efficiency of the solar cells.

DETAILED DESCRIPTION OF THE PREFERRED EMBODIMENTS

Objectives, features, and advantages of the present disclosure are hereunder illustrated with specific embodiments and described below.

Unless otherwise specified, the sign "%" used below shall mean "weight %".

The present disclosure provides a conductive paste comprising an organic carrier, aluminum powder, and phenoxy alkyl alcohol. The phenoxy alkyl alcohol accounts for 2~10%, preferably 2~8%, of the weight of the conductive paste. Furthermore, the phenoxy alkyl alcohol is provided preferably in the form of a solvent. Furthermore, the phenoxy alkyl alcohol is preferably phenoxy ethanol or phenoxy propanol, but the present invention is not limited thereto.

Furthermore, a method of preparing a conductive paste composition according to this embodiment comprises step S1, step S2 and step S3.

Step S1: mixing an organic solvent and resin or cellulose to form a uniform organic carrier. Furthermore, step S1 further entails adding an additive, as needed, to form the organic carrier.

Step S2: mixing the aluminum powder, the phenoxy alkyl alcohol and the organic carrier and grinding the mixture to form a conductive paste precursor. Furthermore, step S2 further entails adding glass frit, as needed, to mix the glass frit with the organic carrier and grinding the mixture, so as to form the conductive paste precursor. In step S2, preferably, the grinding process is performed with a three-roll grinder (model number: Exakt 80E) to obtain the conductive paste precursor.

Step S3: stirring the conductive paste precursor obtained in step S2 to blend and disperse it, so as to form the conductive paste composition.

Furthermore, in step S1, the organic carrier has viscosity of around 1~15 Kcps, preferably 10~15 Kcps. By controlling the viscosity of the organic carrier, it is practicable for the conductive paste composition to have an optimal viscosity.

Furthermore, in step 51, the cellulose (or resin) accounts for 1~4%, preferably 2~3%, of the weight of the conductive paste composition. Choices of the resin include wood rosin and polyacrylonitrile, but the present disclosure is not limited thereto. Choices of the cellulose include ethyl cellulose and propyl cellulose, but the present disclosure is not limited thereto.

Furthermore, in step S1, if an additive is added, the additive accounts for around 0.2~2.5%, preferably 1.5~2%, of the total weight of the conductive paste composition. Choices of the additive include a dispersing agent, leveling agent, defoaming agent, anti-precipitant, thixotropy agent, and coupling agent, but the present disclosure is not limited thereto.

Furthermore, in step S2, the phenoxy alkyl alcohol accounts for 2~10%, preferably 2~8%, of the total weight of the conductive paste composition.

Furthermore, in step S2, if the glass frit is added, the glass frit accounts for 0.1~5%, preferably 3~4%, of the total weight of the conductive paste composition. Choices of the glass frit include vanadium-based, bismuth-based glass frit or the other types of glass frit, preferably the glass frit shown in Table 1 below, but the present disclosure is not limited thereto. A variant embodiment involves using just one type of glass frit or a combination of various types of glass frit.

TABLE 1

| | |
|---|---|
| glass frit 1 | $PbO-ZnO-B_2O_3-SiO_2$ |
| glass frit 2 | $SiO_2-PbO-B_2O_3-Al_2O_3-ZrO_2$ |
| glass frit 3 | $Bi_2O_3-ZnO-SiO_2-B_2O_3-Al_2O_3$ |
| glass frit 4 | $Bi_2O_3-B_2O_3-Al_2O_3-BaO-ZnO$ |
| glass frit 5 | $SiO_2-PbO-ZnO-B_2O_3-Al_2O_3$ |
| glass frit 6 | $V_2O_5-B_2O_3-Al_2O_3-BaO-ZnO$ |

Referring to Table 2, the conductive paste composition in an embodiment is described below.

TABLE 2

| constituents | conductive paste composition |
|---|---|
| resin (or cellulose) | 1~4% |
| organic solvent | 5~20% |
| phenoxy alkyl alcohol | 2~10% |
| additive | 0.2~2.5% |
| glass frit | 0.1~5% |
| aluminum powder | 60~85% |

In an embodiment illustrative of the conductive paste composition, resin (or cellulose) accounts for 1~4% of the weight of the conductive paste composition 1, an organic solvent accounts for 5~20% of the weight of the conductive paste composition, phenoxy alkyl alcohol accounts for 2~10% of the weight of the conductive paste composition, an additive accounts for 0.2~2.5 of the weight of the conductive paste composition, glass frit accounts for 0.1~5% of the weight of the conductive paste composition, and aluminum powder accounts for 60~85% of the weight of the conductive paste composition. By confining the constituents, and proportions thereof, of the conductive paste composition to the aforesaid scope, it is practicable to obtain solar bifacial cells capable of further reducing fine-line line broadening.

Choices of the organic solvent include alcohol ether-based organic solvent, ester alcohol film-forming agent (TEXANOL®, EASTMAN CHEMICAL COMPANY), terpineol and diethylene glycol monobutyl ether, but the present disclosure is not limited thereto.

Preparation of Conductive Paste Composition

The conductive paste composition in comparisons 1~6 and embodiments 1~8 is prepared according to step S1 through step S3 and the formulas shown in Table 3 and Table 4 below.

TABLE 3

| conductive paste composition | comparison 1 | comparison 2 | embodiment 1 | embodiment 2 | embodiment 3 | embodiment 4 | comparison 3 |
|---|---|---|---|---|---|---|---|
| resin (or cellulose) | 3% | 3% | 3% | 3% | 3% | 3% | 3% |
| dispersing agent | 1% | 1% | 1% | 1% | 1% | 1% | 1% |
| diethylene glycol monobutyl ether | 15% | 14% | 13% | 11% | 7% | 5% | 0% |
| phenoxyethanol | 0% | 1% | 2% | 4% | 8% | 10% | 15% |
| glass frit 6 | 2% | 2% | 2% | 2% | 2% | 2% | 2% |
| glass frit 5 | 1% | 1% | 1% | 1% | 1% | 1% | 1% |
| aluminum powder 1 | 9% | 9% | 9% | 9% | 9% | 9% | 9% |
| aluminum powder 2 | 69% | 69% | 69% | 69% | 69% | 69% | 69% |
| Total | 100.0% | 100.0% | 100.0% | 100.0% | 100.0% | 100% | 100% |

TABLE 4

| conductive paste composition | comparison 1 | comparison 2 | embodiment 1 | embodiment 2 | embodiment 3 | embodiment 4 | comparison 3 |
|---|---|---|---|---|---|---|---|
| resin (or cellulose) | 3% | 3% | 3% | 3% | 3% | 3% | 3% |
| dispersing agent | 1% | 1% | 1% | 1% | 1% | 1% | 1% |
| diethylene glycol monobutyl ether | 15% | 14% | 13% | 11% | 7% | 5% | 0% |
| phenoxyethanol | 0% | 1% | 2% | 4% | 8% | 10% | 15% |
| glass frit 6 | 2% | 2% | 2% | 2% | 2% | 2% | 2% |
| glass frit 5 | 1% | 1% | 1% | 1% | 1% | 1% | 1% |
| aluminum powder 1 | 9% | 9% | 9% | 9% | 9% | 9% | 9% |
| aluminum powder 2 | 69% | 69% | 69% | 69% | 69% | 69% | 69% |
| Total | 100.0% | 100.0% | 100.0% | 100.0% | 100.0% | 100% | 100% |

Furthermore, constituents used in comparisons 1~6 and embodiments 1~8 are shown in Table 5 below.

TABLE 5

| | |
|---|---|
| resin (or cellulose) | ETHOCEL Std 20 |
| dispersing agent | Disponer 910 |
| glass frit 6 | $V_2O_5$—$B_2O_3$—$Al_2O_3$—BaO—ZnO |
| glass frit 5 | $SiO_2$—PbO—ZnO—$B_2O_3$—$Al_2O_3$ |
| aluminum powder 1 | Hunan Golden Horse Co., Ltd. FO103 |
| aluminum powder 2 | Hunan Golden Horse Co., Ltd. JM607 |

The viscosity, line height, line width, and electrical properties of the aluminum powder-containing conductive paste composition prepared in embodiments 1~8 and comparisons 1~6 are measured, and the results are shown in Table 6 and Table 7.

Viscosity

The viscosity of the aluminum powder-containing conductive paste composition prepared in embodiments 1~8 and comparisons 1~6 is measured at 25±0.3° C., 0.5 rpm and 20 rpm with Brookfield DVII viscometer.

Line Height and Line Width

A screening fabric with 325 mesh and 23 µm diameter wire is used as a screening template, with a designated pattern which has a line width of 150 µm, and an emulsion thickness of 20 µm. The aluminum powder-containing conductive paste composition prepared in embodiments 1~8 and comparisons 1~6 is printed on a blank (bifacial) PERC cell with a printer, using the same template and under the same printing condition. Then, it is dried at 150~250° C. before being sent to a high-temperature sintering furnance (for removal of organic matter and aluminum layer sintering). Afterward, the line height and line width of the fine lines are measured with a 3D microscope, so as to calculate the aspect ratio (%) and line broadening ratio (%) with equations below.

aspect ratio (%)=line height (µm)/line width (µm)     equation (1)

line broadening (%)=(sintered line width (µm)−designated pattern line width (µm))/designated pattern line width (µm))     equation (2)

Electrical Properties

A screening fabric with 325 mesh and 23 µm diameter wire is used as a screening template, with a designated pattern which has line width of 150 µm, and an emulsion thickness of 20 µm. The aluminum powder-containing conductive paste composition prepared in embodiments 1~8 and comparisons 1~6 is printed on a blank (bifacial) PERC cell with a printer, using the same template and under the same printing condition. Then, it is dried at 150~250° C. before being sent to a high-temperature sintering furnance (for removal of organic matter and aluminum layer sintering). Front-side and back surface electrical properties of the sintering (bifacial) PERC cell are measured by a voltage current test (IV test) to test the photovoltaic conversion efficiency (Eff) (%) of the bifacial PERC cell, open-circuit voltage (Voc(V)) and short-circuit current (Isc(A)), wherein the testing machine is QuickSun 120CA produced by Finland-based Endeas.

TABLE 6

| conductive paste composition | | comparison 1 | comparison 2 | embodiment 1 | embodiment 2 | embodiment 3 | embodiment 4 | comparison 3 |
|---|---|---|---|---|---|---|---|---|
| viscosity (Kcp) | 0.5 rpm | 139.70 | 155.31 | 173.15 | 230.19 | 290.05 | 273.31 | 330.11 |
|  | 20.0 rpm | 24.12 | 26.33 | 28.41 | 32.73 | 37.72 | 36.11 | 42.21 |
| line height (μm) | | 25.1 | 25.1 | 25.1 | 25.4 | 25.3 | 25.4 | 25.4 |
| line width (μm) | | 188.3 | 186.1 | 176.4 | 173.3 | 168.1 | 167.3 | 167.2 |
| aspect ratio (%) | | 13.33 | 13.48 | 14.23 | 14.66 | 15.05 | 15.18 | 15.19 |
| line broadening (%) | | 25.53 | 24.07 | 17.60 | 15.53 | 12.07 | 11.53 | 11.47 |
| front side | Voc (V) | 0.659 | 0.660 | 0.662 | 0.661 | 0.657 | 0.657 | 0.657 |
|  | Isc (A) | 9.713 | 9.071 | 9.614 | 9.618 | 9.658 | 9.658 | 9.608 |
|  | Eff (%) | 21.132 | 21.121 | 21.070 | 21.101 | 21.021 | 21.022 | 21.023 |
| back side | Voc (V) | 0.650 | 0.650 | 0.653 | 0.653 | 0.649 | 0.649 | 0.649 |
|  | Isc (A) | 6.579 | 6.579 | 6.756 | 6.780 | 6.893 | 6.891 | 6.891 |
|  | Eff (%) | 14.140 | 14.250 | 14.530 | 14.600 | 14.796 | 14.780 | 14.780 |
| overall efficiency Eff (%) | | 35.272 | 35.371 | 35.600 | 35.701 | 35.817 | 35.802 | 35.803 |

TABLE 7

| conductive paste composition | | comparison 4 | comparison 5 | embodiment 5 | embodiment 6 | embodiment 7 | embodiment 8 | comparison 6 |
|---|---|---|---|---|---|---|---|---|
| viscosity (Kcp) | 0.5 rpm | 139.70 | 170.80 | 193.15 | 253.19 | 286.00 | 300.05 | 330.11 |
|  | 20.0 rpm | 24.12 | 28.93 | 31.1 | 36.11 | 37.72 | 39.7 | 42.21 |
| line height (μm) | | 25.1 | 25.1 | 25.4 | 25.3 | 25.4 | 25.4 | 25.1 |
| line width (μm) | | 188.3 | 186.4 | 170.3 | 169.1 | 168.3 | 167.3 | 167.2 |
| aspect ratio (%) | | 13.86 | 14.23 | 14.91 | 14.96 | 15.09 | 15.18 | 13.86 |
| line broadening (%) | | 25.53 | 24.27 | 13.53 | 12.73 | 12.20 | 11.53 | 11.47 |
| front side | Voc (V) | 0.6592 | 0.661 | 0.662 | 0.661 | 0.657 | 0.657 | 0.657 |
|  | Isc (A) | 9.713 | 9.041 | 9.614 | 9.618 | 9.698 | 9.658 | 9.608 |
|  | Eff (%) | 21.132 | 21.121 | 21.080 | 21.101 | 21.022 | 21.022 | 21.023 |
| back side | Voc (V) | 0.6500 | 0.650 | 0.653 | 0.654 | 0.649 | 0.649 | 0.649 |
|  | Isc (A) | 6.579 | 6.579 | 6.756 | 6.781 | 6.893 | 6.891 | 6.891 |
|  | Eff (%) | 14.140 | 14.230 | 14.533 | 14.612 | 14.799 | 14.782 | 14.781 |
| overall efficiency Eff (%) | | 35.272 | 35.351 | 35.613 | 35.712 | 35.82 | 35.80 | 35.804 |

As shown in Table 6, by adding the phenoxy ethanol, the aspect ratio of the conductive paste composition tends to increase, whereas the line broadening ratio tends to decrease. The line broadening ratio and aspect ratio without the addition of phenoxy ethanol (comparison 1) are around 25% and 13%, respectively. In embodiment 3, embodiment 4 and comparison 3, the line broadening ratio decreases to 11~12%, whereas the aspect ratio increases to 15% or above. The viscosity increases with the proportion of phenoxy ethanol. Furthermore, although the line broadening ratio and aspect ratio in comparison 3 are satisfactory, the conductive paste composition on the screening template is unlikely to enter meshes if the viscosity of the conductive paste composition exceeds 300 Kcp @0.5 rpm (because the viscosity of the conductive paste composition preferably does not exceed 300 Kcp). Hence, the viscosity in comparison 3 is overly high and thus is unsatisfactory. With embodiment 4 being similar to comparison 3 in aspect ratio, line broadening ratio, and overall efficiency, it is inferable that if the addition ratio of phenoxy ethanol exceeds 10%, the 10% increase in the aspect ratio, line broadening ratio and overall efficiency will not bring special, remarkable effect. Therefore, a critical effect is achieved as soon as the addition ratio of phenoxy ethanol is 10%. Excessive addition of phenoxy ethanol leads to excessive viscosity, and thus the conductive paste composition on the template fails to enter meshes. Therefore, the addition ratio of phenoxy ethanol should preferably not exceed 10%.

Furthermore, as indicated by comparison 1 and comparison 2, if a mere 1% of phenoxy ethanol is added, there will not be any significant improvement in the aspect ratio, line broadening ratio and overall efficiency. Referring to comparison 1 and embodiment 1, the aspect ratio, line broadening ratio and overall efficiency in embodiment 1 are significantly improved. For instance, the introduction of 1% phenoxy ethanol (comparison 2) causes the line broadening ratio in comparison 1 (0% phenoxy ethanol) to decrease by around 1% and the overall efficiency in comparison 1 (0% phenoxy ethanol) to increase by around 0.1%. The introduction of 2% phenoxy ethanol (embodiment 1) causes the line broadening ratio in comparison 1 (0% phenoxy ethanol) to decrease by around 8% and the overall efficiency in comparison 1 (0% phenoxy ethanol) to increase by around 0.33%. Therefore, the addition ratio of phenoxy ethanol should preferably be above 2%.

As shown in Table 6, embodiment 3 is good at the aspect ratio, line broadening ratio and overall efficiency, especially overall efficiency which increases to 35.817%. Hence, embodiment 3 achieves the most preferable implementation.

Table 7 indicates the same tendency as Table 6. For instance, although comparison 6 involves adding 15% phenoxy propanol, its aspect ratio is 13.86%, that is, the same as the aspect ratio achieved without the addition of phenoxy propanol (in comparison 4 (0% phenoxy propanol)). Furthermore, comparison 6 achieves viscosity which exceeds 300 Kcp @0.5 rpm and thus is unsatisfactory. By contrast, both the aspect ratio (15.18%) and the viscosity (300.05 Kcp) in embodiment 8 (10% phenoxy propanol) are preferable; hence, the addition ratio of phenoxy propanol should preferably not exceed 10%. Furthermore, like what is indicated in Table 6, the addition of 1% phenoxy propanol (comparison 5) causes the line broadening ratio in comparison 4 (0% phenoxy propanol) to decrease by around 1.3% and the overall efficiency in comparison 4 (0% phenoxy propanol) to increase by around 0.08%. The addition of 2% phenoxy propanol (embodiment 5) causes the line broadening ratio in comparison 4 (0% phenoxy propanol) to decrease by around 12% and the overall efficiency in comparison 4 (0% phenoxy propanol) to increase by around 0.34%. Therefore, the addition ratio of phenoxy propanol should preferably be above 2%.

Therefore, even if phenoxy ethanol is replaced with phenoxy propanol (or the other type of phenoxy alkyl alcohol), the similar effect will be achieved. Furthermore, the addition ratio of phenoxy propanol should preferably be 2∞10%, preferably 2∞8%, and most preferably 8% (in embodiment 7 the overall efficiency is 35.82%).

Therefore, as indicated in Table 6 and Table 7, the addition ratio of phenoxy alkyl alcohol is preferably 2∞10%, preferably 2∞8%, and most preferably 8% (embodiments 3, 7).

Since fine-line printing is especially suitable for bifacial cell conductive paste, if back-side aluminum layer wirings are narrow, back-side light-receiving area will increase. As indicated in Table 6 and Table 7, in the course of the measurement of the front side, although the short-circuit current (Isc) may decrease because the back aluminum layer area decreases and thus light reflecting off the aluminum layer decreases, the wirings formed from the phenoxy alkyl alcohol-containing conductive paste composition have low line broadening and high aspect ratio, their back-side measured efficiency increases because of a reduction in light-blocking area, thereby giving rise to an increase in the summation of front-side and back-side efficiency.

In conclusion, the present disclosure is advantageous in that the use of phenoxy alkyl alcohol reduces the line broadening issue of fine line printing, enhances the aspect ratio of wirings, increases the photovoltaic conversion efficiency, thereby allowing phenoxy alkyl alcohol to be applicable to solar cells which employ fine line printing, for example, PERC bifacial cells and local back surface field solar cells.

The present disclosure is disclosed above by preferred embodiments. However, persons skilled in the art should understand that the preferred embodiments are illustrative of the present disclosure only, but shall not be interpreted as restrictive of the scope of the present disclosure. Hence, all equivalent modifications and replacements made to the aforesaid embodiments shall fall within the scope of the present disclosure. Accordingly, the legal protection for the present disclosure shall be defined by the appended claims.

What is claimed is:

1. A conductive paste composition, comprising:
   aluminum powder;
   an organic carrier comprising an organic solvent except for phenoxy ethanol and resin or cellulose; and
   phenoxy ethanol accounting for 2~10% of weight of the conductive paste composition.

2. The conductive paste composition of claim 1, wherein the phenoxy ethanol accounts for 2~8% of weight of the conductive paste composition.

3. The conductive paste composition of claim 2, wherein the aluminum powder accounts for 60~85% of weight of the conductive paste composition.

4. A solar cell, comprising the conductive paste composition of claim 3.

5. The conductive paste composition of claim 2, wherein the organic carrier has viscosity of 1~15 Kcps.

6. The conductive paste composition of claim 2, further comprising glass frit.

7. The conductive paste composition of claim 2, wherein the organic carrier further comprises an additive selected from the group consisting of dispersing agent, leveling agent, defoaming agent, anti-precipitant, thixotropy agent and coupling agent.

8. A solar cell, comprising the conductive paste composition of claim 2.

9. The conductive paste composition of claim 1, wherein the aluminum powder accounts for 60~85% of weight of the conductive paste composition.

10. A solar cell, comprising the conductive paste composition of claim 9.

11. The conductive paste composition of claim 1, wherein the organic carrier has viscosity of 1~15 Kcps.

12. A solar cell, comprising the conductive paste composition of claim 11.

13. The conductive paste composition of claim 1, further comprising glass frit.

14. The conductive paste composition of claim 1, wherein the organic carrier further comprises an additive selected from the group consisting of dispersing agent, leveling agent, defoaming agent, anti-precipitant, thixotropy agent and coupling agent.

15. A solar cell, comprising the conductive paste composition of claim 1.

* * * * *